(12) United States Patent
Huang et al.

(10) Patent No.: US 12,495,506 B2
(45) Date of Patent: Dec. 9, 2025

(54) MULTI-LAYER CIRCUIT BOARD STRUCTURE AND MEMORY STORAGE DEVICE

(71) Applicant: PHISON ELECTRONICS CORP., Miaoli (TW)

(72) Inventors: Chun Ming Huang, Yunlin County (TW); Yong Lin Chen, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 178 days.

(21) Appl. No.: 18/587,951

(22) Filed: Feb. 27, 2024

(65) Prior Publication Data
US 2025/0254800 A1  Aug. 7, 2025

(30) Foreign Application Priority Data
Feb. 2, 2024  (TW) .................. 113104088

(51) Int. Cl.
| H05K 3/00 | (2006.01) |
| H05K 1/02 | (2006.01) |
| H05K 3/46 | (2006.01) |
| H05K 7/14 | (2006.01) |

(52) U.S. Cl.
CPC ......... *H05K 3/4623* (2013.01); *H05K 1/0298* (2013.01); *H05K 3/4614* (2013.01); *H05K 7/1427* (2013.01); *H05K 2201/0364* (2013.01)

(58) Field of Classification Search
CPC .. H05K 3/4623; H05K 1/0298; H05K 3/4614; H05K 7/1427; H05K 2201/0364
See application file for complete search history.

(56) References Cited

U.S. PATENT DOCUMENTS

| 2013/0180104 A1* | 7/2013 | Moul ................... H01P 11/003 29/846 |
| 2020/0375055 A1* | 11/2020 | Noda ...................... H05K 1/181 |
| 2025/0024595 A1* | 1/2025 | Kikuchi ............... H05K 1/0251 |

* cited by examiner

*Primary Examiner* — Pete T Lee
(74) *Attorney, Agent, or Firm* — JCIPRNET

(57) ABSTRACT

A multi-layer circuit board structure and a memory storage device are disclosed. The multi-layer circuit board structure includes a first capacity component, a second capacity component, a first conductor, and a first via hole. The first via hole is connected to the first conductor. At a first layer of the multi-layer circuit board structure, a first capacity component and a second capacity component are arranged oppositely. The first capacity component is connected to a first extension part of the first conductor. The second capacity component is connected to a second extension part of the first conductor. The first via hole is connected to a third extension part of the first conductor, and the first via hole is disposed between the first capacity component and the second capacity component.

20 Claims, 5 Drawing Sheets

MULTI-LAYER CIRCUIT BOARD STRUCTURE AND MEMORY STORAGE DEVICE

CROSS-REFERENCE TO RELATED APPLICATION

This application claims the priority benefit of Taiwan application serial no. 113104088, filed on Feb. 2, 2024. The entirety of the above-mentioned patent application is hereby incorporated by reference herein and made a part of this specification.

BACKGROUND

Technical Field

The disclosure relates to a multi-layer circuit board structure and a memory storage device.

Description of Related Art

Generally speaking, in a multi-layer printed circuit board, an end of the trace may be connected to one or more capacitors, and then the trace is connected to a ground layer through a via hole. However, simply connecting capacitors in series cannot effectively suppress the electromagnetic interference (EMI) generated by the trace near the ends thereof.

SUMMARY

The disclosure provides a multi-layer circuit board structure and a memory storage device, which can reduce electromagnetic interference generated by some electronic components.

Exemplary embodiments of the disclosure provide a multi-layer circuit board structure, which includes a first capacity component, a second capacity component, a first conductor, and a first via hole. The first via hole is connected to the first conductor. At the first layer of the multi-layer circuit board structure, the first capacity component and the second capacity component are arranged oppositely. The first capacity component is connected to a first extension part of the first conductor. The second capacity component is connected to a second extension part of the first conductor. The first via hole is connected to a third extension part of the first conductor. The first via hole is disposed between the first capacity component and the second capacity component.

An exemplary embodiment of the disclosure further provides a memory storage device, which includes a connection interface unit, a rewritable non-volatile memory module, a memory control circuit unit, and the multi-layer circuit board structure. The multi-layer circuit board structure is coupled to at least one of the connection interface unit, the rewritable non-volatile memory module, and the memory control circuit unit. The multi-layer circuit board structure includes the first capacity component, the second capacity component, the first conductor, and the first via hole. The first via hole is connected to the first conductor. At the first layer of the multi-layer circuit board structure, the first capacity component and the second capacity component are arranged oppositely. The first capacity component is connected to the first extension part of the first conductor. The second capacity component is connected to the second extension part of the first conductor. The first via hole is connected to the third extension part of the first conductor. The first via hole is disposed between the first capacity component and the second capacity component.

Based on the above, at the first layer of the multi-layer circuit board structure, the first capacity component and the second capacity component are arranged oppositely. The first capacity component, the second capacity component, and the first via hole are respectively connected to the first extension part, the second extension part, and the third extension part of the first conductor. The first via hole is disposed between the first capacity component and the second capacity component. In this way, the electromagnetic interference generated by the electronic components can be reduced.

DESCRIPTION OF THE EMBODIMENTS

Figure 1A:
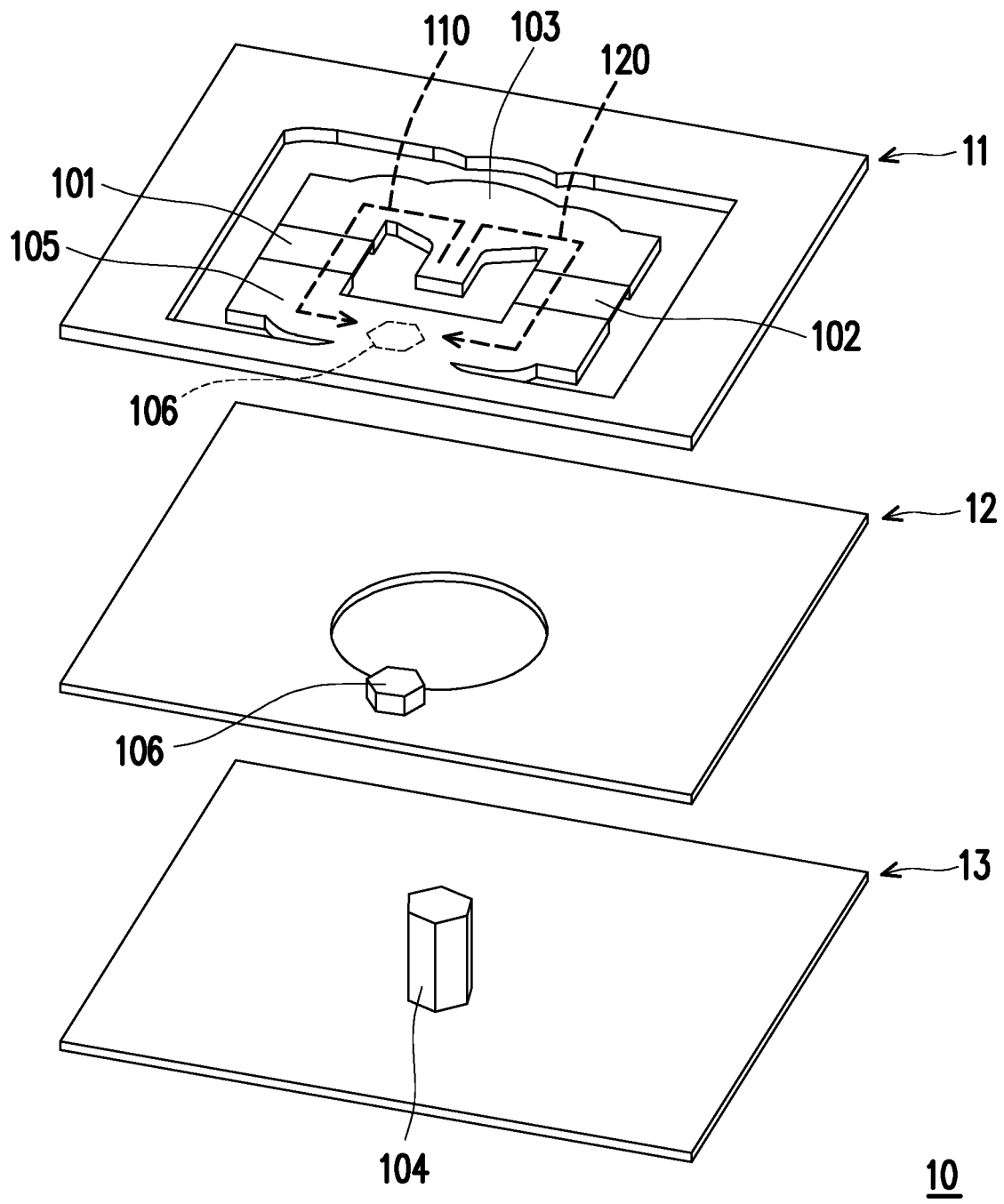
FIGS. 1A and 1B are schematic diagrams of a multi-layer circuit board structure according to an exemplary embodiment of the disclosure.
Figure 1B:
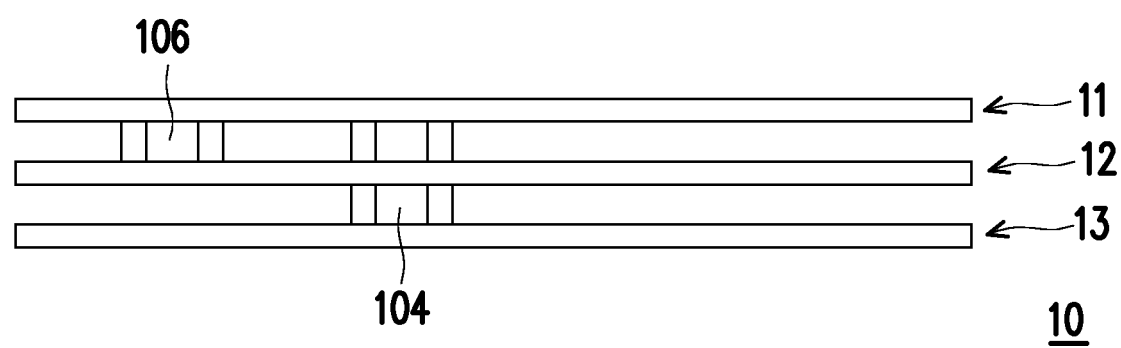
Figure 2:
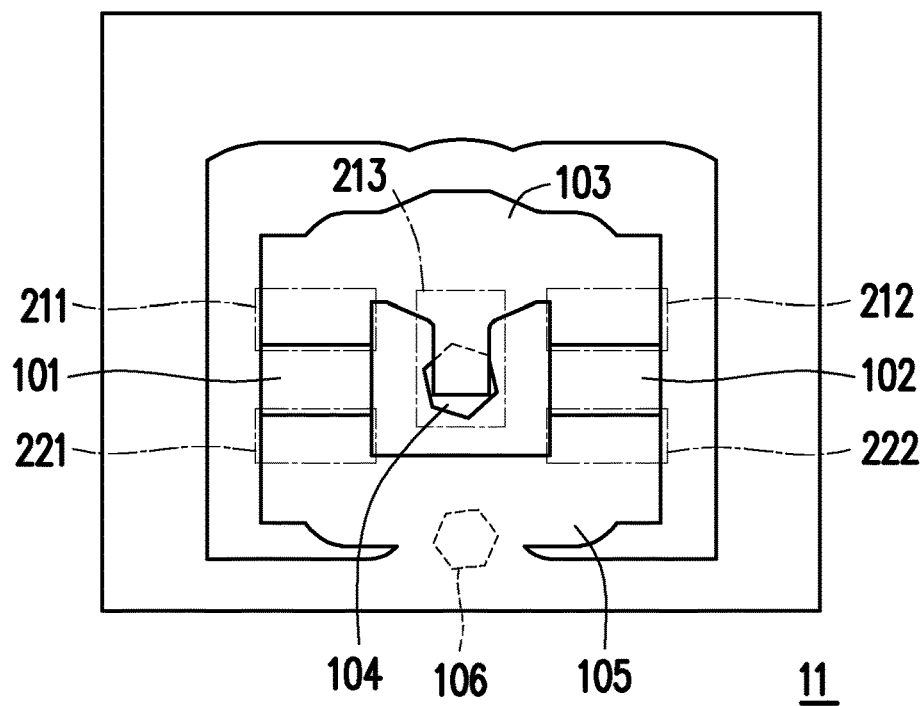
FIG. 2 is a schematic diagram of a component layout of a first layer of a multi-layer circuit board structure according to an exemplary embodiment of the disclosure.
Figure 3:
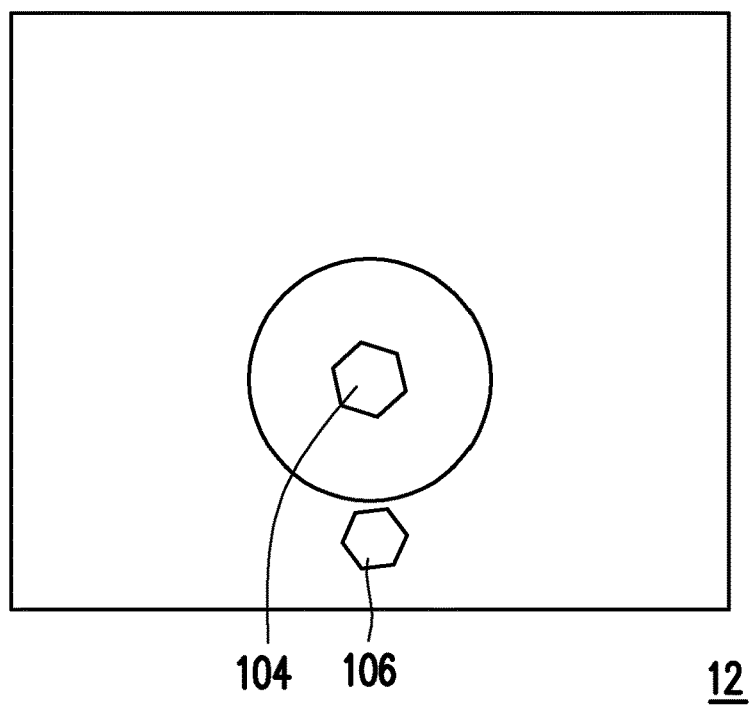
FIG. 3 is a schematic diagram of a component layout of a second layer of a multi-layer circuit board structure according to an exemplary embodiment of the disclosure.
Figure 4:
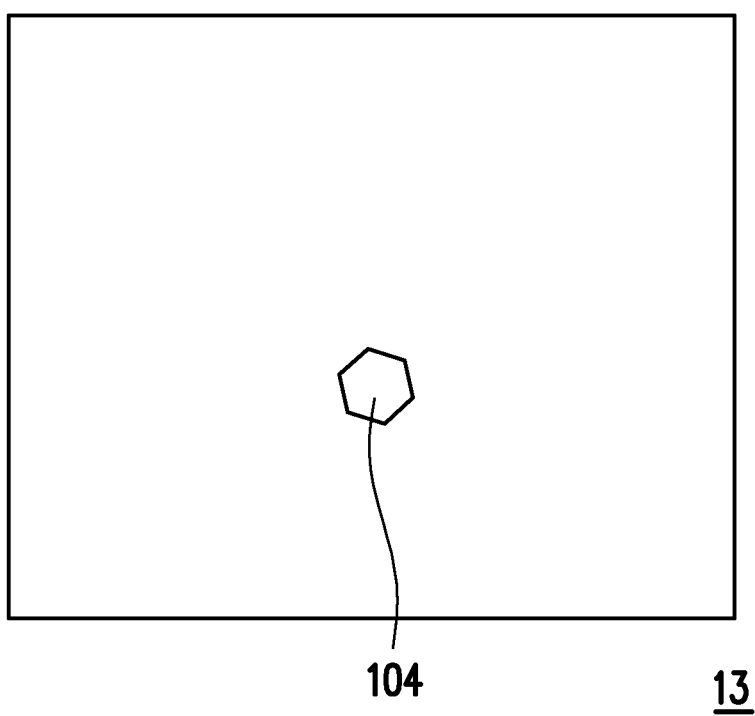
FIG. 4 is a schematic diagram of a component layout of a third layer of a multi-layer circuit board structure according to an exemplary embodiment of the disclosure.

FIGS. 1A and 1B are schematic diagrams of a multi-layer circuit board structure according to an exemplary embodiment of the disclosure. FIG. 2 is a schematic diagram of a component layout of a first layer of a multi-layer circuit board structure according to an exemplary embodiment of the disclosure. FIG. 3 is a schematic diagram of a component layout of a second layer of a multi-layer circuit board structure according to an exemplary embodiment of the disclosure. FIG. 4 is a schematic diagram of a component layout of a third layer of a multi-layer circuit board structure according to an exemplary embodiment of the disclosure.

Referring to FIGS. 1A, 1B to 4, a multi-layer circuit board structure 10 includes a first layer 11, a second layer 12, and a third layer 13. There may be an insulating layer between the first layer 11 and the second layer 12. There may also be an insulating layer between the second layer 12 and the third layer 13. In addition, there may be more layers between the first layer 11 and the second layer 12 and/or between the second layer 12 and the third layer 13, which are not limited by the disclosure.

In an exemplary embodiment, the multi-layer circuit board structure 10 includes a capacity component (also refer to as a first capacity component) 101, a capacity component (also refer to as a second capacity component) 102, a conductor (also refer to as a first conductor) 103, and a via hole (also refer to as a first via hole) 104. The capacity component 101, the capacity component 102, and the conductor 103 are disposed on the first layer 11. For example, the capacity components 101 and 102 include a capacitor respectively. For example, in the first layer 11, the capacity components 101 and 102 may be disposed oppositely. In an exemplary embodiment, the capacity components 101 and/ or 102 may also be replaced by other types of electronic components, such as resistors and/or inductors, which are not limited by the disclosure.

In an example embodiment, the via hole 104 may be connected to the conductor 103. For example, the via hole 104 may be used to conduct an electrical path (also refer to as a first electrical path) between the conductor 103 and the third layer 13. For example, the via hole 104 may penetrate the first layer 11 to the third layer 13 to conduct the first electrical path.

In an exemplary embodiment, the conductor 103 has an extension part (also refer to as a first extension part) 211, an extension part (also refer to as a second extension part) 212, and an extension part (also refer to as a third extension part) 213. In the first layer 11, an end (also refer to as a first end) of the capacity component 101 may be connected to the extension part 211 of the conductor 103. An end (also refer to as a first end) of the capacity component 102 may be connected to the extension part 212 of the conductor 103. The via hole 104 may be connected to the extension part 213 of the conductor 103. For example, at the first layer 11, the via hole 104 may be disposed in the extension part 213. Thereby, the conductor 103 may be electrically conducted to the third layer 13 through the extension part 213 and the via hole 104.

In an example embodiment, the extension parts 211, 212, and 213 of the conductor 103 may allow the conductor 103 to have an E-shaped structure. In an example embodiment, assuming that lengths of the extension parts 211, 212, and 213 are D11, D12, and D13 respectively, D11 may be equal to D12, and D13 may be greater than D11 (and/or D12). In an example embodiment, D13 may also be less than or equal to D11 (and/or D12). It should be noted that D11, D12, and D13 may also be adjusted according to practical needs and are not limited by the disclosure.

In an exemplary embodiment, at the first layer 11, the via hole 104 is disposed between the capacity components 101 and 102. For example, at the first layer 11, assuming that the capacity component 101 is located on the left side of the via hole 104, the capacity component 102 is located on the right side of the via hole 104.

In an example embodiment, at the first layer 11, the via hole 104 may be disposed at a center point between the capacity components 101 and 102 or near the center point. In an example embodiment, at the first layer 11, a virtual connection line (i.e., a straight line) between the capacity components 101 and 102 may pass through the location where the via hole 104 is disposed.

In an exemplary embodiment, the multi-layer circuit board structure 10 further includes a conductor (also referred to as a second conductor) 105 and a via hole (also referred to as a second via hole) 106. The conductor 105 is disposed on first layer 11. For example, in the first layer 11, the conductors 103 and 105 may be arranged oppositely. For example, assuming that the conductor 103 is located above the capacity components 101 and 102, the conductor 105 may be located below the capacity components 101 and 102.

In an example embodiment, the via hole 106 may be connected to conductor 105. For example, the via hole 106 may be used to conduct an electrical path (also referred to as a second electrical path) between the conductor 105 and the second layer 12. For example, the via hole 106 may penetrate the first layer 11 and the second layer 12 to conduct the second electrical path.

In an exemplary embodiment, the conductor 105 has an extension part (also referred to as a first extension part) 221 and an extension part (also refer to as a second extension part) 222. In the first layer 11, another end (also refer to as a second end) of the capacity component 101 may be connected to the extension part 221 of the conductor 105, and another end (also refer to as a second end) of the capacity component 102 may be connected to the extension part 222 of the conductor 105.

In an exemplary embodiment, the extension parts 221 and 222 of the conductor 105 may allow the conductor 105 to have a U-shaped structure. In an exemplary embodiment, assuming that the lengths of the extension parts 221 and 222 are D21 and D22 respectively, D21 may be equal to D22. It should be noted that D21 and D22 may also be adjusted according to practical needs, and are not limited by the disclosure.

In an exemplary embodiment, at the first layer 11, the via hole 106 is not disposed in the extension parts 221 and 222. For example, at the first layer 11, the via hole 106 may be disposed below the capacity components 101 and 102 (or the extension parts 221 and 222) and approximately in the middle between the capacity components 101 and 102. Thereby, the conductor 105 may be electrically conducted to the second layer 12 through the via hole 106.

In an exemplary embodiment, the first layer 11 is a power and ground mixed layer. The second layer 12 is a ground layer. The third layer 13 is a power layer. That is, a power signal and a reference ground signal may coexist in the first layer 11. The second layer 12 may be used to provide the reference ground signal. The third layer 13 may be used to provide the power signal. In an exemplary embodiment, the functions of the first layer 11, the second layer 12, and the third layer 13 may be adjusted according to practical needs, and are not limited by the disclosure.

In an exemplary embodiment, at the first layer 11, the conductor 103 is connected to the conductor 105 (only) through the capacity components 101 and 102. In an exemplary embodiment, at the first layer 11, adjacent parts between the extension part 213 of the conductor 103 and the capacity component 101, the capacity component 102, and the conductor 105 are all hollowed out. Therefore, the power signal from the extension part 213 of the conductor 103 may only enter the capacity components 101 and 102 through the extension parts 211 and 212 respectively, and then is transmitted to the conductor 105 through the capacity components 101 and 102.

In an exemplary embodiment, after the power signal provided by the third layer 13 (i.e., the power layer) is guided to the extension part 213 of the conductor 103 through the via hole 104, in the conductor 103, the power signal may be transmitted along power paths 110 and 120 which are symmetrical to each other to the left and right sides of the conductor 103 and enter parallel to the extension parts 211 and 212 of the conductor 103. The extension parts 211 and 212 of the conductor 103 may transmit the power signal to the conductor 105 through the capacity components 101 and 102 respectively. The conductor 105 may then further guide the power signal to the second layer 12 (i.e., the ground layer) through the via hole 106.

In an exemplary embodiment, the power signal is transmitted through the power paths 110 and 120 in FIG. 1A, and magnetic fields generated by the power signal on the left and right sides of the conductor 103 may cancel or suppress each other. In this way, an electromagnetic interference (EMI) generated by the power signal may be effectively reduced or suppressed.

In an exemplary embodiment, the multi-layer circuit board structure 10 may be disposed in a memory storage device. However, in another exemplary embodiment, the multi-layer circuit board structure 10 may also be disposed in other types of electronic devices, and is not limited to memory storage devices.

Figure 5:
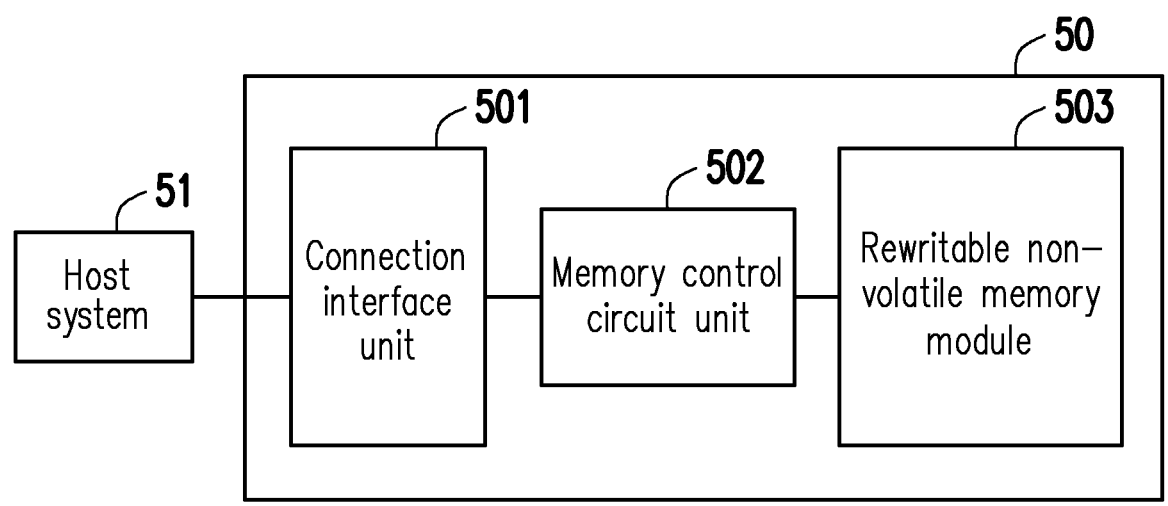
FIG. 5 is a schematic diagram of a memory storage device according to an exemplary embodiment of the disclosure.

FIG. 5 is a schematic diagram of a memory storage device according to an exemplary embodiment of the disclosure. Referring to FIG. 5, a memory storage device 50 may be used together with a host system 51. The host system 51 may write data into the memory storage device 50 or read data from the memory storage device 50. For example, the host system 51 is any system that may substantially cooperate with the memory storage device 50 to store data, such as a desktop computer, a notebook computer, a smart phone, a tablet computer, or a vehicle-mounted computer. The disclosure does not limit the types of the host system 51 and the memory storage device 50.

The memory storage device 50 includes a connection interface unit 501, a memory control circuit unit 502, and a rewritable non-volatile memory module 503. In particular, the multi-layer circuit board structure 10 may be disposed in the memory storage device 50. For example, the multi-layer circuit board structure 10 may be coupled to at least one of the connection interface unit 501, the memory control circuit unit 502, and the rewritable non-volatile memory module 503.

The connection interface unit 501 is used to couple the memory storage device 50 to the host system 51. For example, the connection interface unit 51 may be compatible with a peripheral component interconnect express (PCI Express) standard, a serial advanced technology attachment (SATA) standard, a parallel advanced technology attachment (PATA) standard, an universal serial bus (USB) standard, or other suitable standards.

The memory control circuit unit 502 is coupled to the connection interface unit 501 and the rewritable non-volatile memory module 503. The memory control circuit unit 502 may communicate with the host system 51 through the connection interface unit 501 (e.g., exchange signals). In addition, the memory control circuit unit 502 may access the rewritable non-volatile memory module 503 according to instructions from the host system 51. For example, the memory control circuit unit 502 may write, read, and erase data in the rewritable non-volatile memory module 503 according to instructions from the host system 51. For example, the memory control circuit unit 502 may include a memory controller.

The rewritable non-volatile memory module 503 is used to store data written by the host system 51. For example, the rewritable non-volatile memory module 53 may include a single level cell (SLC) NAND flash memory module (that is, a flash memory module that may store one bit in one memory cell), a multi level cell (MLC) NAND flash memory module (that is, a flash memory module that may store two bits in one memory cell), a triple level cell (TLC) NAND flash memory module (that is, a flash memory module that may store three bits in one memory cell), a quad level cell (QLC) NAND type flash memory module (i.e., a flash memory module that may store four bits in one memory cell), other types of flash memory modules, or other memory modules with the same or similar characteristics.

To sum up, the exemplary embodiments of the disclosure propose the first conductor (for example, having the E-shaped structure) and the second conductor (for example, having the U-shaped structure) with a specific structure, and based on a specially designed arrangement (for example, the first capacity component, the second capacity component, and the first via hole are arranged in a straight line) to configure related components. In this way, the electromagnetic interference generated by the power signals transmitted in the multi-layer circuit board structure (and the memory storage device) may be effectively reduced or suppressed.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A multi-layer circuit board structure, comprising:
a first capacity component;
a second capacity component;
a first conductor; and
a first via hole, connected to the first conductor,
wherein at a first layer of the multi-layer circuit board structure, the first capacity component and the second capacity component are arranged oppositely, the first capacity component is connected to a first extension part of the first conductor, the second capacity component is connected to a second extension part of the first conductor, the first via hole is connected to a third extension part of the first conductor, and the first via hole is disposed between the first capacity component and the second capacity component.

2. The multi-layer circuit board structure according to claim 1, further comprising:
a second conductor; and
a second via hole, connected to the second conductor,
wherein at the first layer of the multi-layer circuit board structure, the first conductor and the second conductor are arranged oppositely, the first capacity component is further connected to a first extension part of the second conductor, and the second capacity component is further connected to a second extension part of the second conductor.

3. The multi-layer circuit board structure according to claim 2, wherein the first extension part of the first conductor is connected to a first end of the first capacity component, the second extension part of the first conductor is connected to a first end of the second capacity component, the first extension part of the second conductor is connected to a second end of the first capacity component, and the second extension part of the second conductor is connected to a second end of the second capacity component.

4. The multi-layer circuit board structure according to claim 1, wherein the first via hole is configured to conduct an electrical path between the first conductor and a third layer of the multi-layer circuit board structure.

5. The multi-layer circuit board structure according to claim 4, wherein the third layer of the multi-layer circuit board structure is a power layer.

6. The multi-layer circuit board structure according to claim 2, wherein the second via hole is configured to conduct an electrical path between the second conductor and a second layer of the multi-layer circuit board structure.

7. The multi-layer circuit board structure according to claim 6, wherein the second layer of the multi-layer circuit board structure is a ground layer.

8. The multi-layer circuit board structure according to claim 1, wherein the first conductor has an E-shaped structure.

9. The multi-layer circuit board structure according to claim 2, wherein the second conductor has a U-shaped structure.

10. The multi-layer circuit board structure according to claim 2, wherein in the multi-layer circuit board structure, the first conductor is connected to the second conductor only through the first capacity component and the second capacity component.

11. A memory storage device, comprising:
a connection interface unit, configured to couple to a host system;
a rewritable non-volatile memory module;
a memory control circuit unit; and
a multi-layer circuit board structure, coupled to at least one of the connection interface unit, the rewritable non-volatile memory module, and the memory control circuit unit,
wherein the multi-layer circuit board structure comprises:
a first capacity component;
a second capacity component;
a first conductor; and
a first via hole, connected to the first conductor,
wherein at the first layer of the multi-layer circuit board structure, the first capacity component and the second capacity component are arranged oppositely, the first capacity component is connected to a first extension part of the first conductor, and the second capacity component is connected to a second extension part of the first conductor, the first via hole is connected to a third extension part of the first conductor, and the first via hole is disposed between the first capacity component and the second capacity component.

12. The memory storage device according to claim 11, wherein the multi-layer circuit board structure further comprises:
a second conductor; and
a second via hole, connected to the second conductor,
wherein at the first layer of the multi-layer circuit board structure, the first conductor and the second conductor are arranged oppositely, the first capacity component is further connected to a first extension part of the second conductor, and the second capacity component is further connected to a second extension part of the second conductor.

13. The memory storage device according to claim 12, wherein the first extension part of the first conductor is connected to a first end of the first capacity component, the second extension part of the first conductor is connected to a first end of the second capacity component, the first extension part of the second conductor is connected to a second end of the first capacity component, and the second extension part of the second conductor is connected to a second end of the second capacity component.

14. The memory storage device according to claim 11, wherein the first via hole is configured to conduct an electrical path between the first conductor and a third layer of the multi-layer circuit board structure.

15. The memory storage device according to claim 14, wherein the third layer of the multi-layer circuit board structure is a power layer.

16. The memory storage device according to claim 12, wherein the second via hole is configured to conduct an electrical path between the second conductor and a second layer of the multi-layer circuit board structure.

17. The memory storage device according to claim 16, wherein the second layer of the multi-layer circuit board structure is a ground layer.

18. The memory storage device according to claim 11, wherein the first conductor has an E-shaped structure.

19. The memory storage device according to claim 12, wherein the second conductor has a U-shaped structure.

20. The memory storage device according to claim 12, wherein in the multi-layer circuit board structure, the first conductor is connected to the second conductor only through the first capacity component and the second capacity component.

* * * * *